(12) United States Patent
Sun et al.

(10) Patent No.: US 8,420,951 B2
(45) Date of Patent: Apr. 16, 2013

(54) PACKAGE STRUCTURE

(75) Inventors: Shih-Hao Sun, Hsinchu County (TW); Chang-Fu Chen, Hsinchu County (TW)

(73) Assignee: Subtron Technology Co. Ltd., Hsinchu County (TW)

( * ) Notice: Subject to any disclaimer, the term of this patent is extended or adjusted under 35 U.S.C. 154(b) by 57 days.

(21) Appl. No.: 13/162,547

(22) Filed: Jun. 16, 2011

(65) Prior Publication Data
US 2012/0279772 A1 Nov. 8, 2012

(30) Foreign Application Priority Data
May 3, 2011 (TW) .............................. 100115473 A

(51) Int. Cl.
*H05K 3/00* (2006.01)
(52) U.S. Cl.
USPC ................ 174/260; 29/829; 29/832; 29/840; 29/852; 174/261; 438/124; 438/125; 438/126; 438/666
(58) Field of Classification Search .................... 29/829, 29/832, 840, 852; 174/260, 261; 438/124, 438/125, 126
See application file for complete search history.

(56) References Cited

U.S. PATENT DOCUMENTS

| 7,919,851 | B2 * | 4/2011 | Fan ............................... 257/700 |
| 8,227,298 | B2 * | 7/2012 | Abbott .......................... 438/126 |
| 2009/0283890 | A1 * | 11/2009 | Karnezos ...................... 257/686 |
| 2009/0294027 | A1 * | 12/2009 | Wang ............................ 156/150 |
| 2010/0320610 | A1 * | 12/2010 | Huang et al. .................. 257/773 |
| 2012/0279772 | A1 * | 11/2012 | Sun et al. ...................... 174/260 |

* cited by examiner

*Primary Examiner* — Carl Arbes
(74) *Attorney, Agent, or Firm* — Jianq Chyun IP Office

(57) ABSTRACT

A manufacturing method of a package structure is provided. In the manufacturing method, a metal substrate having a seed layer is provided. A patterned circuit layer is formed on a portion of the seed layer. A first patterned dry film layer is formed on the other portion of the seed layer. A surface treatment layer is electroplated on the patterned circuit layer with use of the first patterned dry film layer as an electroplating mask. The first patterned dry film layer is removed. A chip bonding process is performed to electrically connect a chip to the surface treatment layer. An encapsulant is formed on the metal substrate. The encapsulant encapsulates the chip, the surface treatment layer, and the patterned circuit layer. The metal substrate and the seed layer are removed to expose a bottom surface of the encapsulant and a lower surface of the patterned circuit layer.

5 Claims, 5 Drawing Sheets

PACKAGE STRUCTURE

CROSS-REFERENCE TO RELATED APPLICATION

This application claims the priority benefit of Taiwan application serial no. 100115473, filed on May 3, 2011. The entirety of the above-mentioned patent application is hereby incorporated by reference herein and made a part of this specification.

BACKGROUND OF THE INVENTION

1. Field of the Invention

The invention relates to a package structure and a manufacturing method thereof. More particularly, the invention relates to a package structure with a relatively small thickness and a manufacturing method of the package structure.

2. Description of Related Art

A chip package aims at protecting an exposed chip, lowering the density of chip contacts, and effectively dissipating heat generated by the chip. A common way to package a chip is to configure the chip to a package carrier by wire bonding or flip-chip bonding, such that contacts on the chip can be electrically connected to the package carrier. Therefore, the contacts on the chip can be re-distributed through the package carrier, so as to comply with contact distribution of external devices of next hierarchy.

Generally, in order to form the package carrier, a core dielectric layer often serves as a core material, and patterned circuit layers and patterned dielectric layers are alternately stacked on the core dielectric layer by performing a fully additive process, a semi-additive process, a subtractive process, or any other process. Thereby, the thickness of the core dielectric layer accounts for a great proportion of the entire thickness of the package carrier. As a result, if the thickness of the core dielectric layer cannot be effectively reduced, it will be very difficult to reduce the entire thickness of the package structure.

SUMMARY OF THE INVENTION

The invention is directed to a package structure with a relatively small thickness.

The invention is further directed to a manufacturing method of a package structure. By applying the manufacturing method, the aforesaid package structure can be formed.

In an embodiment of the invention, a manufacturing method of a package structure is provided. According to the manufacturing method, a metal substrate is provided. The metal substrate has a first surface, a second surface, and a side surface that connects the first surface and the second surface. The first and second surfaces are opposite to each other. A seed layer that covers the first surface, the second surface, and the side surface is already formed on the metal substrate. A patterned circuit layer is formed on a portion of the seed layer that is located on the first surface of the metal substrate. A first patterned dry film layer is formed on the other portion of the seed layer that is located on the first surface of the metal substrate. A surface treatment layer is electroplated on the patterned circuit layer with use of the first patterned dry film layer as an electroplating mask. The first patterned dry film layer is removed. A chip bonding process is performed to electrically connect a chip to the surface treatment layer. An encapsulant is formed on the metal substrate. The encapsulant encapsulates the chip, the surface treatment layer, and the patterned circuit layer. The metal substrate and the seed layer are removed to expose a bottom surface of the encapsulant and a lower surface of the patterned circuit layer.

According to an embodiment of the invention, the step of forming the patterned circuit layer includes electroplating the patterned circuit layer on the portion of the seed layer with use of the first patterned dry film layer as the electroplating mask. Here, the portion of the seed layer is exposed by the first patterned dry film layer.

According to an embodiment of the invention, in the step of forming the patterned circuit layer, a metal layer is formed on the seed layer. The metal layer covers the seed layer. A second patterned dry film layer is formed on a portion of the metal layer located on the first surface. The other portion of the metal layer is removed with use of the second patterned dry film layer as an etching mask, so as to expose the other portion of the seed layer that is located on the first surface. The patterned circuit layer is formed. The second patterned dry film layer is removed.

According to an embodiment of the invention, the surface treatment layer includes a nickel layer, a gold layer, a silver layer, or a nickel palladium gold layer.

According to an embodiment of the invention, the chip bonding process includes a wire bonding process or a flip-chip bonding process.

In an embodiment of the invention, a package structure that includes a patterned circuit layer, a chip, and an encapsulant is provided. The chip is electrically connected to the patterned circuit layer. The encapsulant encapsulates the chip and the patterned circuit layer and exposes a lower surface of the patterned circuit layer.

According to an embodiment of the invention, the package structure further includes a surface treatment layer that is configured on the patterned circuit layer.

According to an embodiment of the invention, the surface treatment layer includes a nickel layer, a gold layer, a silver layer, or a nickel palladium gold layer.

According to an embodiment of the invention, the chip is electrically connected to the patterned circuit layer by wire bonding or flip-chip bonding.

According to an embodiment of the invention, the lower surface of the patterned circuit layer and a bottom surface of the encapsulant are substantially coplanar.

Based on the above, the metal substrate serves as the carrier according to the above embodiments of the invention, and the patterned circuit layer is formed by performing a plating process or a subtractive process. After the chip is completely packaged, the metal substrate and the seed layer are removed. Thereby, in comparison with the conventional package structure that has the core dielectric layer, the package structure described in the embodiments of the invention can have a relatively small thickness. Besides, the chip is configured on the patterned circuit layer, and the encapsulant exposes the lower surface of the patterned circuit layer. Hence, the heat generated by the chip can be rapidly transmitted to the external surroundings through the patterned circuit layer. As a result, the package structure described in the embodiments of the invention can accomplish favorable heat dissipation efficiency.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide a further understanding of the invention, and are incorporated

DESCRIPTION OF EMBODIMENTS

Figure 1A:
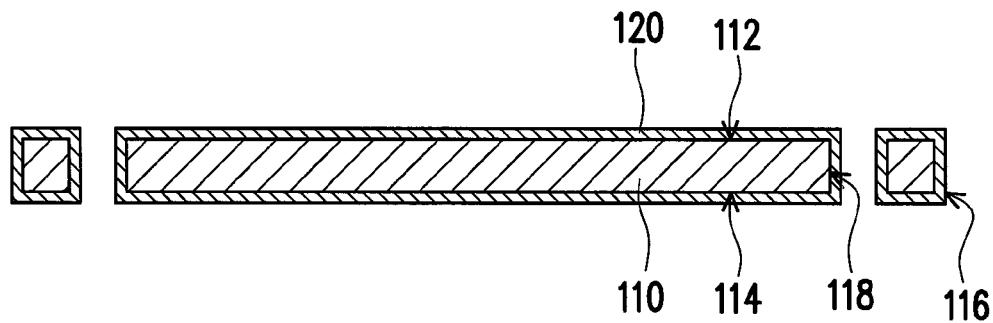
FIG. 1A through FIG. 1E are schematic cross-sectional views illustrating a manufacturing method of a package structure according to an embodiment of the invention.

FIG. 1A through FIG. 1E are schematic cross-sectional views illustrating a manufacturing method of a package structure according to an embodiment of the invention. With reference to FIG. 1A, in the manufacturing method of the package structure of this embodiment, a metal substrate 110 is provided. Here, a seed layer 120 is already formed on the metal substrate 110. Specifically, according to this embodiment, the metal substrate 110 has a first surface 112, a second surface 114, a side surface 116 that connects the first surface 112 and the second surface 114, and at least one tooling hole 118 penetrating the first surface 112 and the second surface 114. Here, the first and second surfaces 112 and 114 are opposite to each other. A material of the metal substrate 110 includes metal having high thermal conductivity, e.g., copper, aluminum, or an alloy (copper alloy or aluminum alloy), which should however not be construed as a limitation to the invention. The seed layer 120 is a chemical copper layer, for instance, and the seed layer 120 is electroplated on the first surface 112, the second surface 114, the side surface 116, and an inner wall of the tooling hole 118 of the metal substrate 110.

Figure 1B:
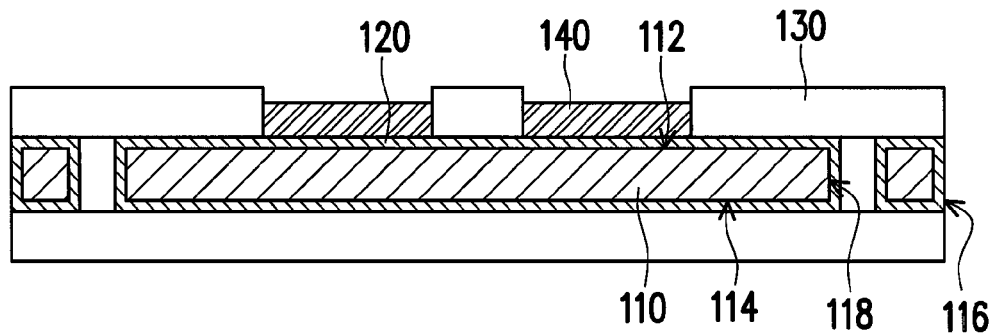

With reference to FIG. 1B, a patterned dry film layer 130 is formed on the seed layer 120. Here, the patterned dry film layer 130 exposes a portion of the seed layer 120. Specifically, the patterned dry film layer 130 completely covers both the seed layer 120 located above the second surface 114 of the metal substrate 110 and the two ends of the tooling hole 118, while the patterned dry film layer 130 exposes a portion of the seed layer 120 located above the first surface 112 of the metal substrate 110.

With reference to FIG. 1B, a patterned circuit layer 140 is formed on the portion of the seed layer 120 exposed by the patterned dry film layer 130. In this embodiment, for instance, an electroplating process is performed with use of the patterned dry film layer 130 to electroplate the patterned circuit layer 140 on the portion of the seed layer 120 that is located above the first surface 112 of the metal substrate 110 and exposed by the patterned cry film layer 130. The line width and the thickness of the patterned circuit layer 140 can be adjusted by controlling the patterned dry film layer 130 in this embodiment. Here, the line width of the patterned circuit layer 140 is smaller than 30 μm, for instance, and therefore the patterned circuit layer 140 of this embodiment can be considered as a fine circuit layer in comparison with the normal circuit layer.

Figure 1C:
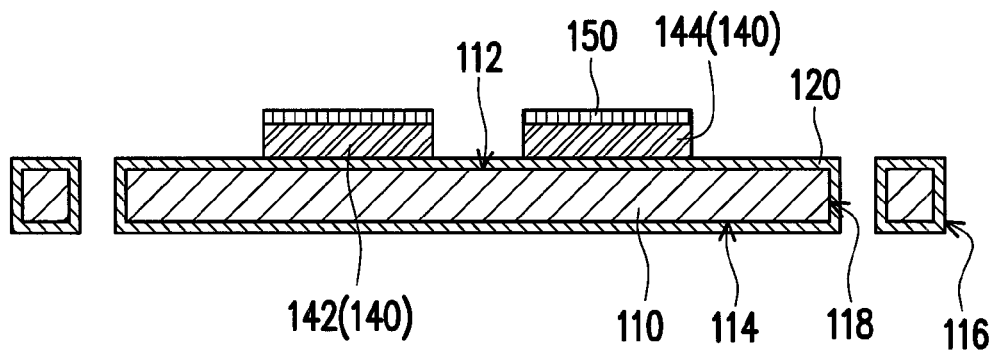

With reference to FIG. 1C, a surface treatment layer 150 is formed on the patterned circuit layer 140. The surface treatment layer 150 is, for instance, a nickel layer, a gold layer, a silver layer, a nickel palladium gold layer, or any other appropriate material layer, which should not be construed as a limitation to the invention. The patterned dry film layer 130 is removed to expose the seed layer 120 that is located on the first surface 112, the second surface 114, and the inner wall of the tooling hole 118 of the metal substrate 110.

Figure 1D:
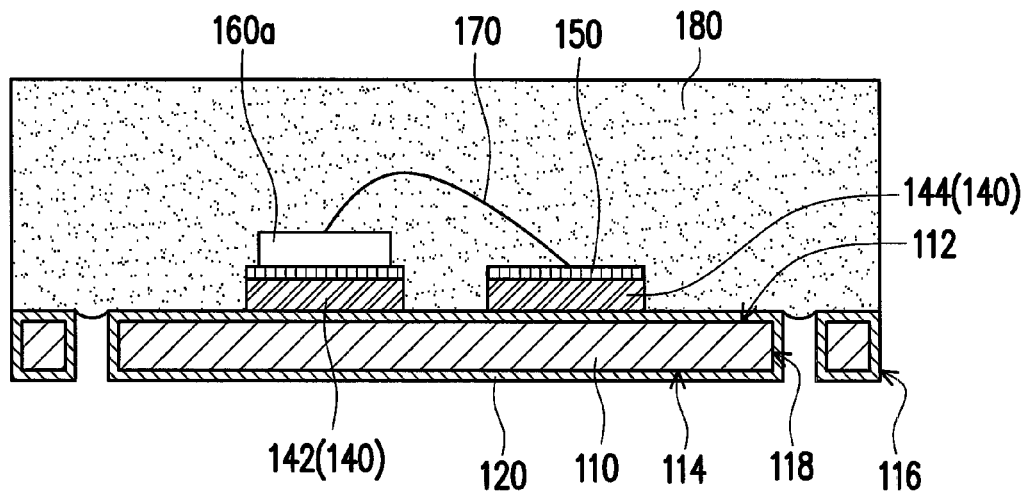

With reference to FIG. 1D, a chip bonding process is performed to electrically connect a chip 160a to the surface treatment layer 150 located above the patterned circuit layer 140. The chip bonding process in this embodiment is a wire bonding process, for instance. In particular, the patterned circuit layer 140 includes a chip pad 142 and at least one pad 144. The chip 160a is configured on the chip pad 142, and the chip 160a is electrically connected to the pad 144 through a bonding wire 170. The chip 160a is, for instance, a chip module or an individual chip that includes a light emitting diode (LED) chip, a laser diode chip, a graphic chip, a memory chip, a semiconductor chip, and so on.

With reference to FIG. 1D, an encapsulant 180 is formed on the metal substrate 110, and the encapsulant 180 encapsulates the chip 160a, the bonding wire 170, the surface treatment layer 150, the patterned circuit layer 140, and the seed layer 120.

Figure 1E:
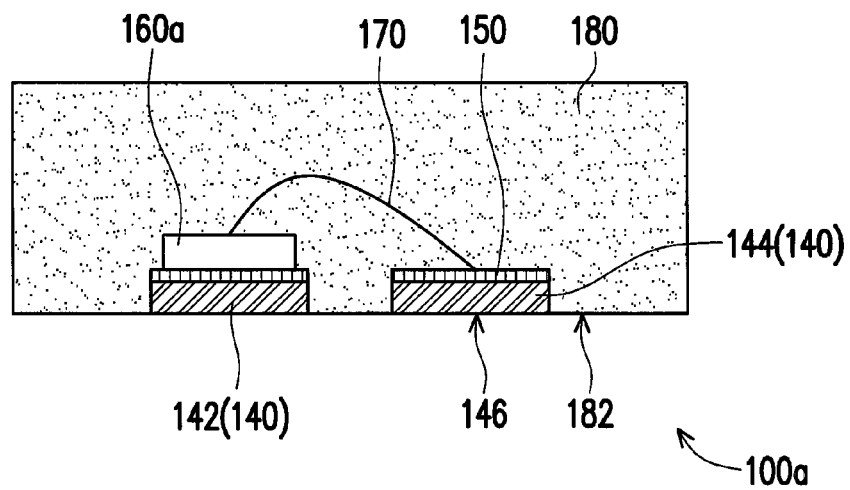

As indicated in FIG. 1D and FIG. 1E, a singulation process is performed to cut the metal substrate 110 along the tooling hole 118. The metal substrate 110 and the seed layer 120 that covers the first surface 112, the second surface 114, and the inner wall of the tooling hole 118 of the metal substrate 110 are removed, so as to expose a bottom surface 182 of the encapsulant 180 and a lower surface 146 of the patterned circuit layer 140. So far, fabrication of the package carrier 100a is substantially completed.

With reference to FIG. 1E, the package structure 100a of this embodiment includes the patterned circuit layer 140, the surface treatment layer 150, the chip 160a, the bonding wire 170, and the encapsulant 180. The patterned circuit layer 140 includes the chip pad 142 and the pad 144. The chip 160a is configured on the chip pad 142 and is electrically connected to the patterned circuit layer 140 through the bonding wire 170. The surface treatment layer 150 is configured on the patterned circuit layer 140. A portion of the surface treatment layer 150 is located between the chip 160a and the chip pad 142. The bonding wire 170 is connected between the chip 160a and the surface treatment layer 150 that is located above the pad 144. The surface treatment layer 150 is a nickel layer, a gold layer, a silver layer, a nickel palladium gold layer, or any other appropriate material layer, for instance. The encapsulant 180 encapsulates the chip 160a, the bonding wire 170, the surface treatment layer 150, and the patterned circuit layer 140 and exposes the lower surface 146 of the patterned circuit layer 140. Specifically, the lower surface 146 of the patterned circuit layer 140 and the bottom surface 182 of the encapsulant 180 are substantially coplanar.

According to the manufacturing method of the package structure 100a of this embodiment, after the chip 160a is completely packaged (i.e., the encapsulant 180 is formed), the metal substrate 110 and the seed layer 120 covering the metal substrate 110 are removed. Thereby, in comparison with the conventional package structure that has the core dielectric layer, the package structure 100a described in this embodiment of the invention does not have the metal substrate 110 and thus can have a relatively small thickness. The removed metal substrate 110 can be used again. Accordingly, compared to the material cost of the conventional package structure with the core dielectric layer, the material cost of the package structure 100a in this embodiment is lowered down. Besides, the chip 160a is configured on the patterned circuit layer 140, and the encapsulant 180 exposes the lower surface 146 of the patterned circuit layer 140. Hence, the heat generated by the chip 160a can be rapidly transmitted to the external surroundings through the patterned circuit layer 140. As a result, the package structure 100a described in this embodiment can accomplish favorable heat dissipation efficiency. In addition, the line width and the thickness of the patterned circuit layer can be controlled by the patterned dry film layer 130 according to this embodiment, and therefore the required fine circuit layer can be formed.

Figure 1F:
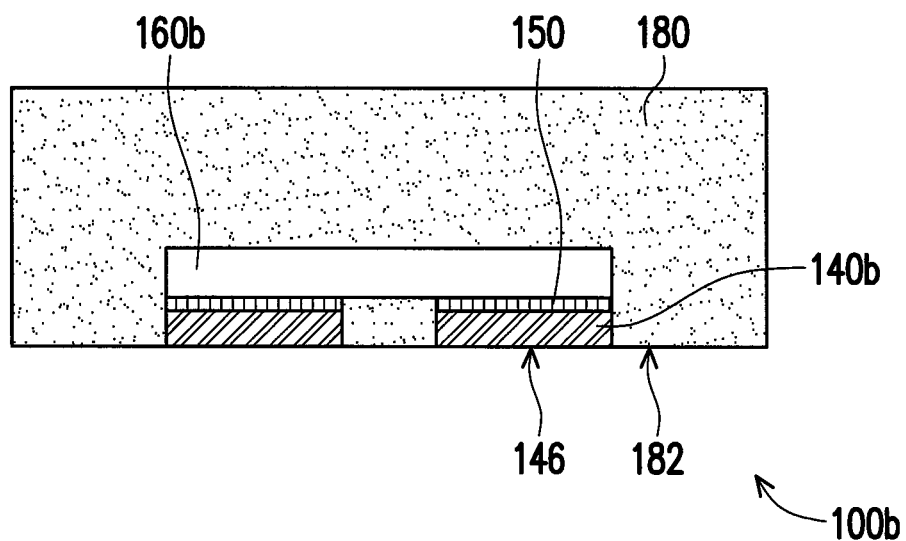
FIG. 1F is a schematic cross-sectional view illustrating a package structure according to another embodiment of the invention.

Although the chip 160a in this embodiment is electrically connected to the surface treatment layer 150 located above the pad 144 (i.e., the patterned circuit layer 140) by wire bonding, the way to bond the chip 160a and the patterned circuit layer 140 is not limited in the invention. According to another embodiment of the invention, the chip 160b of the package structure 100b shown in FIG. 1F can be electrically connected to the surface treatment layer 150 located above the patterned circuit layer 140b by flip-chip bonding. Namely, the way to bond the chip 160a and the patterned circuit layer 140 is exemplary and should not be construed as a limitation to the invention.

A package structure 100c and a manufacturing method thereof are described in the following embodiments. It should be mentioned that some reference numbers and some of the descriptions provided in the previous embodiments are also applicable in the following exemplary embodiments. The same reference numbers denote the same or like components, and descriptions of the same technical contents are omitted. The aforementioned exemplary embodiments can be referred for descriptions of the omitted parts, and thus the omitted parts are not further described in the following exemplary embodiments.

Figure 2A:
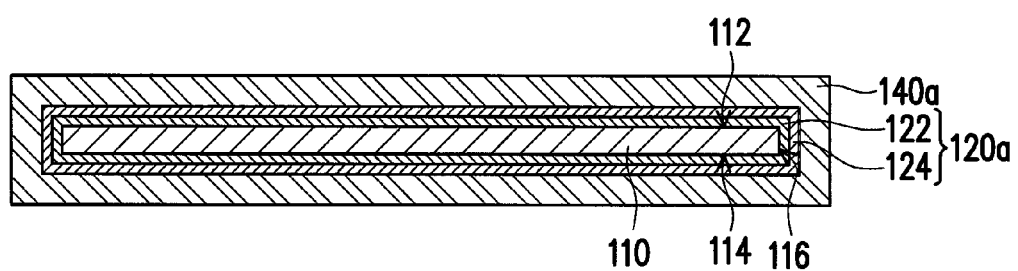
FIG. 2A through FIG. 2D are schematic cross-sectional views illustrating a manufacturing method of a package structure according to another embodiment of the invention.

FIG. 2A through FIG. 2D are schematic cross-sectional views illustrating a manufacturing method of a package structure according to another embodiment of the invention. With reference to FIG. 2A, in the manufacturing method of the package structure of this embodiment, a metal substrate 110 on which a seed layer 120a is formed is provided. The seed layer 120a is comprised of an electroplating seed layer 122 and a nickel layer 124 that covers the electroplating seed layer 122. The seed layer 120a covers the first surface 112, the second surface 114, and the side surface 116 of the metal substrate 110.

As indicated in FIG. 2A, a metal layer 140a is formed on the nickel layer 124 of the seed layer 120a. Here, the metal layer 140a covers the seed layer 120a, and the thickness of the metal layer 140a is greater than the thickness of the seed layer 120a.

Figure 2B:
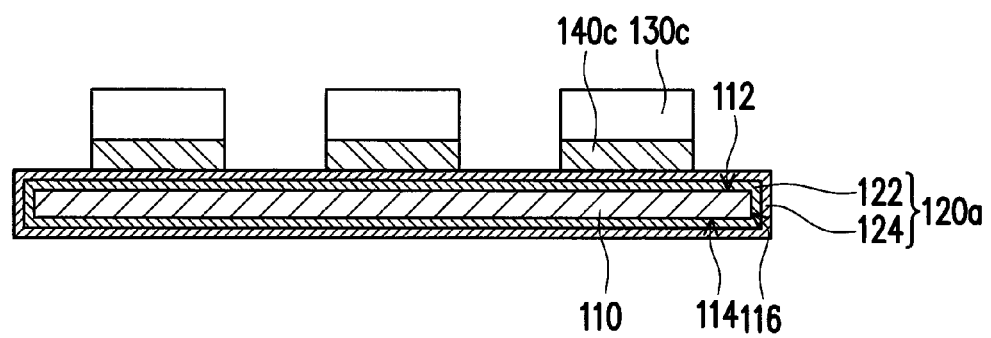

With reference to FIG. 2A and FIG. 2B, a patterned dry film layer 130c is formed on a portion of the metal layer 140a located on the first surface 112 of the metal substrate 110. The other portion of the metal layer 140a is removed with use of the patterned dry film layer 130c as an etching mask, so as to expose a portion of the seed layer 120a located on the first surface 112, and a patterned circuit layer 140c is formed. Namely, in this embodiment, the patterned circuit layer 140c is formed by performing a subtractive process. The patterned dry film layer 130c is removed to expose the patterned circuit layer 140c.

Figure 2C:
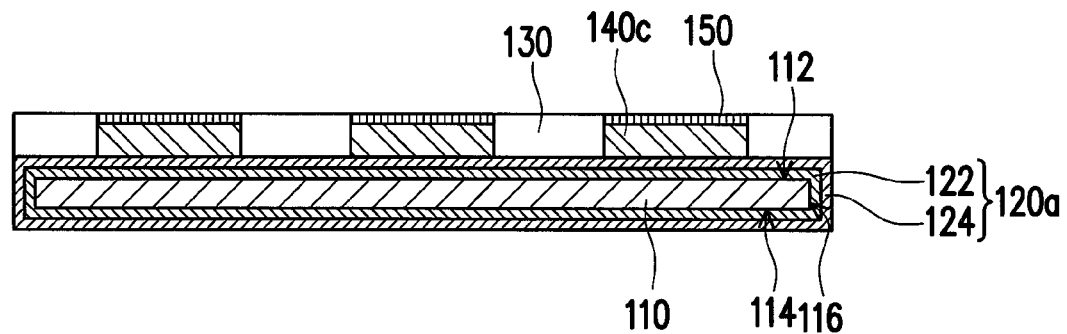

With reference to FIG. 2C, a patterned dry film layer 130 is formed on the exposed portion of the seed layer 120a that is located on the first surface 112 and exposed by the patterned circuit layer 140c, and a dry film layer 130d is formed on the seed layer 120a located on the second surface 114. The dry film layer 130d completely covers the seed layer 120a that is located on the second surface 114. A surface treatment layer 150 is electroplated on the patterned circuit layer 140c with use of the patterned dry film layer 130 as an electroplating mask.

Figure 2D:
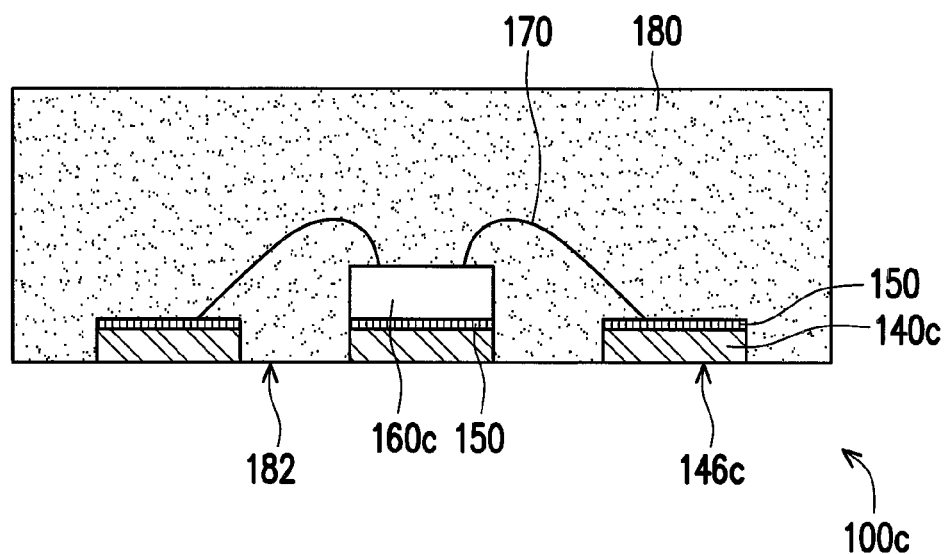

The patterned dry film layer 130 and the dry film layer 130d are removed, and a chip bonding process (e.g., a wire bonding process) is performed to electrically connect a chip 160c to the surface treatment layer 150. An encapsulant 180 is formed on the metal substrate 110 to encapsulate the chip 160c, the surface treatment layer 150, and the patterned circuit layer 140c. The metal substrate 110 and the seed layer 120a are removed to expose the bottom surface 182 of the encapsulant 180 and the lower surface 146c of the patterned circuit layer 140c. So far, the package structure 100c depicted in FIG. 2D is completely formed. At this time, the lower surface 146c of the patterned circuit layer 140c and the bottom surface 182 of the encapsulant 180 are substantially coplanar.

According to the manufacturing method of the package structure 100c of this embodiment, after the package 160c is completely packaged (i.e., the encapsulant 180 is formed), the metal substrate 110 and the seed layer 120a covering the metal substrate 110 are removed. Thereby, in comparison with the conventional package structure that has the core dielectric layer, the package structure 100c described in this embodiment of the invention does not have the metal substrate 110 and thus can have a relatively small thickness. The removed metal substrate 110 can be used again. Accordingly, compared to the material cost of the conventional package structure with the core dielectric layer, the material cost of the package structure 100c in this embodiment is lowered down. Besides, the chip 160c is configured on the patterned circuit layer 140c, and the encapsulant 180 exposes the lower surface 146c of the patterned circuit layer 140c. Hence, the heat generated by the chip 160c can be rapidly transmitted to the external surroundings through the patterned circuit layer 140c. As a result, the package structure 100c described in this embodiment can accomplish favorable heat dissipation efficiency.

In light of the foregoing, the metal substrate serves as the carrier according to the embodiments of the invention, and the patterned circuit layer is formed by performing a plating process or a subtractive process. After the chip is completely packaged, the metal substrate and the seed layer are removed. Thereby, in comparison with the conventional package structure that has the core dielectric layer, the package structure described in the embodiments of the invention does not have the carrier and thus can have a relatively small thickness. Besides, the chip is configured on the patterned circuit layer, and the encapsulant exposes the lower surface of the patterned circuit layer. Hence, the heat generated by the chip can be rapidly transmitted to the external surroundings through the patterned circuit layer. As a result, the package structure described in the embodiments of the invention can accomplish favorable heat dissipation efficiency. Moreover, the line width and the thickness of the patterned circuit layer can be adjusted by controlling the patterned dry film layer in the invention, and therefore the required fine circuit layer can be formed.

Although the invention has been described with reference to the above embodiments, it will be apparent to one of the ordinary skill in the art that modifications to the described embodiments may be made without departing from the spirit of the invention. Accordingly, the scope of the invention will be defined by the attached claims rather than by the above detailed descriptions.

What is claimed is:
1. A package structure formed by:
  providing a metal substrate, the metal substrate having a first surface, a second surface, and a side surface connecting the first surface and the second surface, the first surface and the second surface being opposite to each other, wherein a seed layer covering the first surface, the second surface, and the side surface is located on the metal substrate;

forming a patterned circuit layer on a portion of the seed layer located on the first surface of the metal substrate;

forming a first patterned dry film layer on the other portion of the seed layer located on the first surface of the metal substrate;

electroplating a surface treatment layer on the patterned circuit layer with use of the first patterned dry film layer as an electroplating mask;

removing the first patterned dry film layer;

performing a chip bonding process to electrically connect a chip to the surface treatment layer;

forming an encapsulant on the metal substrate, the encapsulant encapsulating the chip, the surface treatment layer, and the patterned circuit layer; and removing the metal substrate and the seed layer to expose a bottom surface of the encapsulant and a lower surface of the patterned circuit layer, the package structure comprising:

the patterned circuit layer;

the chip electrically connected to the patterned circuit layer; and the encapsulant encapsulating the chip and the patterned circuit layer and exposing the lower surface of the patterned circuit layer.

2. The package structure as recited in claim 1, further comprising the surface treatment layer located on the patterned circuit layer.

3. The package structure as recited in claim 1, wherein the surface treatment layer comprises a nickel layer, a gold layer, a silver layer, or a nickel palladium gold layer.

4. The package structure as recited in claim 1, wherein the chip is electrically connected to the patterned circuit layer by wire bonding or flip-chip bonding.

5. The package structure as recited in claim 1, wherein the lower surface of the patterned circuit layer and the bottom surface of the encapsulant are substantially coplanar.

* * * * *